United States Patent
Mori

Patent Number: 5,216,367
Date of Patent: Jun. 1, 1993

[54] MR IMAGING APPARATUS CAPABLE OF AUTOMATICALLY SELECTING MULTIPLE SURFACE COILS

[75] Inventor: Issei Mori, Tochigi, Japan

[73] Assignee: Kabushiki Kaisha Toshiba, Kanagawa, Japan

[21] Appl. No.: 655,036

[22] Filed: Feb. 14, 1991

[30] Foreign Application Priority Data

Feb. 21, 1990 [JP] Japan .................................. 2-38351

[51] Int. Cl.$^5$ .............................................. G01V 3/00
[52] U.S. Cl. ..................................... 324/318; 324/322; 128/653.5
[58] Field of Search ............... 324/318, 319, 320, 322, 324/309, 307; 128/653.5

[56] References Cited

U.S. PATENT DOCUMENTS

| | | | |
|---|---|---|---|
| 4,782,298 | 11/1988 | Arakawa et al. | 324/318 |
| 4,825,162 | 4/1989 | Roemer et al. | 324/318 |
| 4,859,947 | 8/1989 | Boskamp | 324/318 |
| 4,924,868 | 5/1990 | Krause et al. | 128/653 SC |
| 4,975,644 | 12/1990 | Fox | 324/322 |
| 5,041,789 | 8/1991 | Keller et al. | 324/318 |
| 5,144,243 | 9/1992 | Nakabayashi et al. | 324/318 |

FOREIGN PATENT DOCUMENTS 0374994  6/1990  European Pat. Off. .

*Primary Examiner*—Louis Arana
*Attorney, Agent, or Firm*—Finnegan, Henderson, Farabow, Garrett & Dunner

[57] ABSTRACT

In a magnetic resonance imaging apparatus, there are provided plural receiver coils over a portion of a biological body. Data on a coil energizing sequence is previously stored in a memory. An only limited number of receiving coils are sequentially energized based on the coil energizing sequence data.

9 Claims, 5 Drawing Sheets

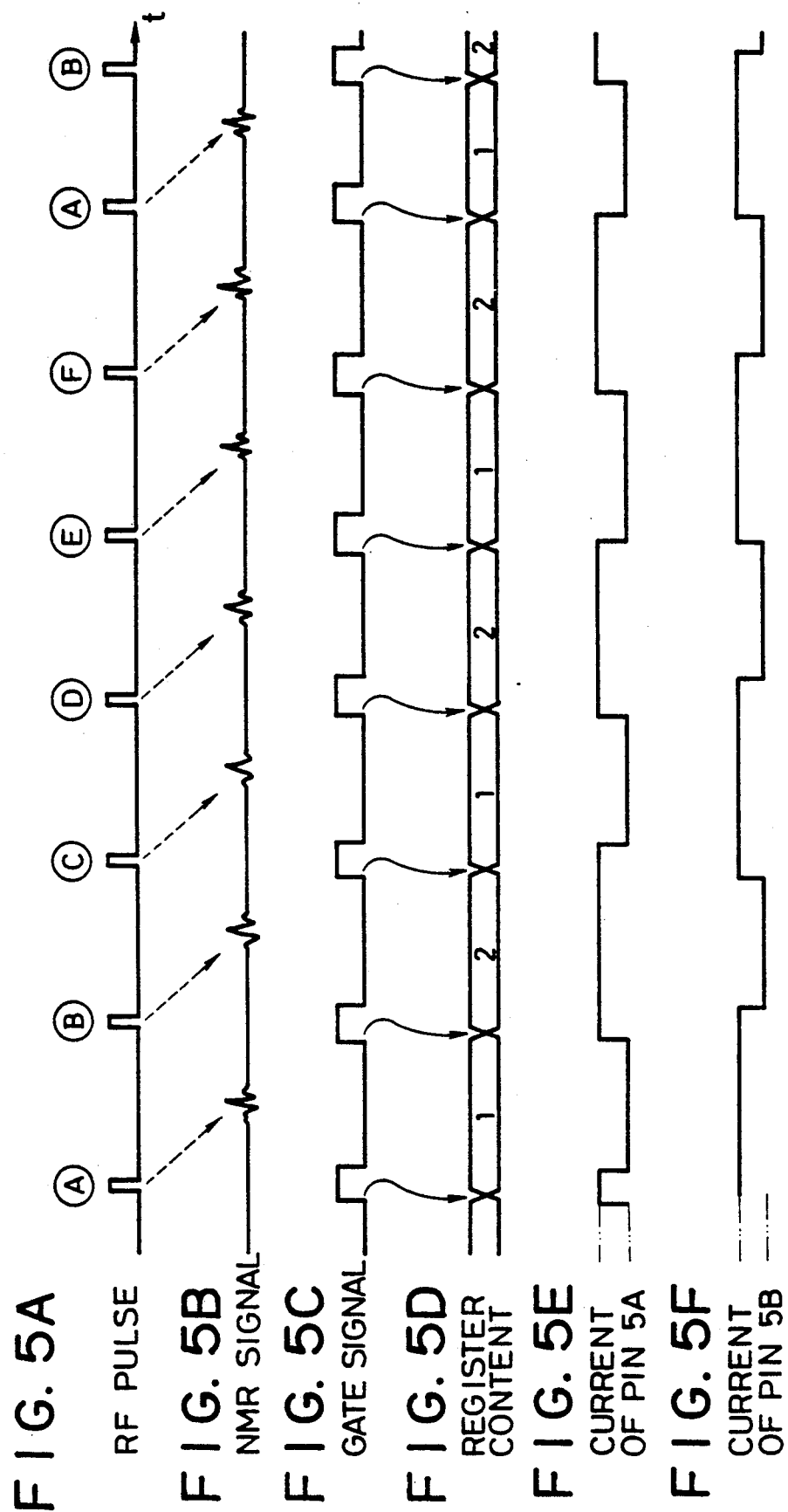

MR IMAGING APPARATUS CAPABLE OF AUTOMATICALLY SELECTING MULTIPLE SURFACE COILS

BACKGROUND OF THE INVENTION

1. Field of the Invention

The present invention generally relates to an MR (magnetic resonance) imaging apparatus for acquiring an MR image of a biological body under medical examination by employing a plurality of surface coils functioning as NMR (nuclear magnetic resonance) signal-receiving coils. More specifically, the present invention is directed to an MR imaging apparatus for selectively energizing these surface coils with respect to a portion of the biological body to be imaged.

2. Description of the Related Art

Very recently, so-called "multiple surface coil type MR imaging apparatuses" have been developed in which a plurality of surface coils functioning as NMR-signal receiving coils are arranged around a biological body under medical examination and only surface coils required for the MR imaging are energized or brought into active conditions so as to improve the S/N ratio. These multiple surface coil type MR imaging apparatuses are known from, for instance, U.S. Pat. Nos. 4,825,162 to Roemer; 4,924,868 to Krause; 4,859,947 to Boskamp.

In such a multiple surface coil type MR imaging apparatus, only one receiver coil positioned at an imaging portion of a biological body is manually selected for energization prior to an MR imaging operation.

However, since the setting position of the surface coil to be energized is previously determined with respect to the biological body, the imaged portion of the biological body is accordingly restricted. As a result, no multi-slice MR imaging operation is carried out in which the NMR signals derived from a large number of slice portions should be acquired.

On the other hand, if a plurality of surface coils having, in general, high sensitivities are simultaneously energized, such high-sensitive surface coils which do not contribute the MR imaging operation are brought into active conditions. As a consequence, the noises generated from the biological body functioning as a conductor are induced in these surface coils, so that the S/N ratio of this case is considerably lowered, as compared with the S/N ratio under such a condition that either a single surface coil, or only limited number of surface coils are energized for MR imaging purpose.

SUMMARY OF THE INVENTION

The present invention has been made in an attempt to solve the above-described problems, and therefore has an object to provide an MR imaging apparatus for automatically selecting surface coils required only for MR imaging operation from a plurality of surface coils closely-spaced with each other.

A magnetic resonance imaging apparatus, according to the present invention, comprises:

a plurality of coil means (1A:1N) having signal sensitive regions with respect to different portions of a biological body to be imaged, for performing at least reception of NMR (nuclear magnetic resonance) signals induced from the different portions of the biological body;

memory means (21) for previously storing data on a sequence for energizing said plural coil means (1A:1N): and, means (11:14) for reading out the sequence data stored in the memory means (21) so as to energize only a selected number of coil means (1A:1N) in accordance with the coil energizing sequence data.

BRIEF DESCRIPTION OF THE DRAWINGS

For a better understanding of the present invention, reference is made to read the following descriptions in conjunction with the accompanying drawings, in which.

DETAILED DESCRIPTION OF THE PREFERRED EMBODIMENTS

Basic Idea

Before proceeding with various preferred embodiments, a basic idea of the present invention will now be described.

In the MR imaging apparatus with the above-described constructions, there are provided a plurality of surface coils and a coil selecting means. A coil energizing sequence is preset in the coil selecting means, whereby only one surface coil, or only limited number of surface coils required for MR imaging operation are selected to be energized during the NMR signal acquisition.

Also, the coil selecting means outputs a coil energizing instruction signal to the relevant surface coils in such a manner that the desirable NMR signals, e.g., FID signals and spin echo signals may be fetched via the energized receiver coil to the MR imaging apparatus.

ARRANGEMENT OF FIRST MR IMAGING APPARATUS

Figure 1:
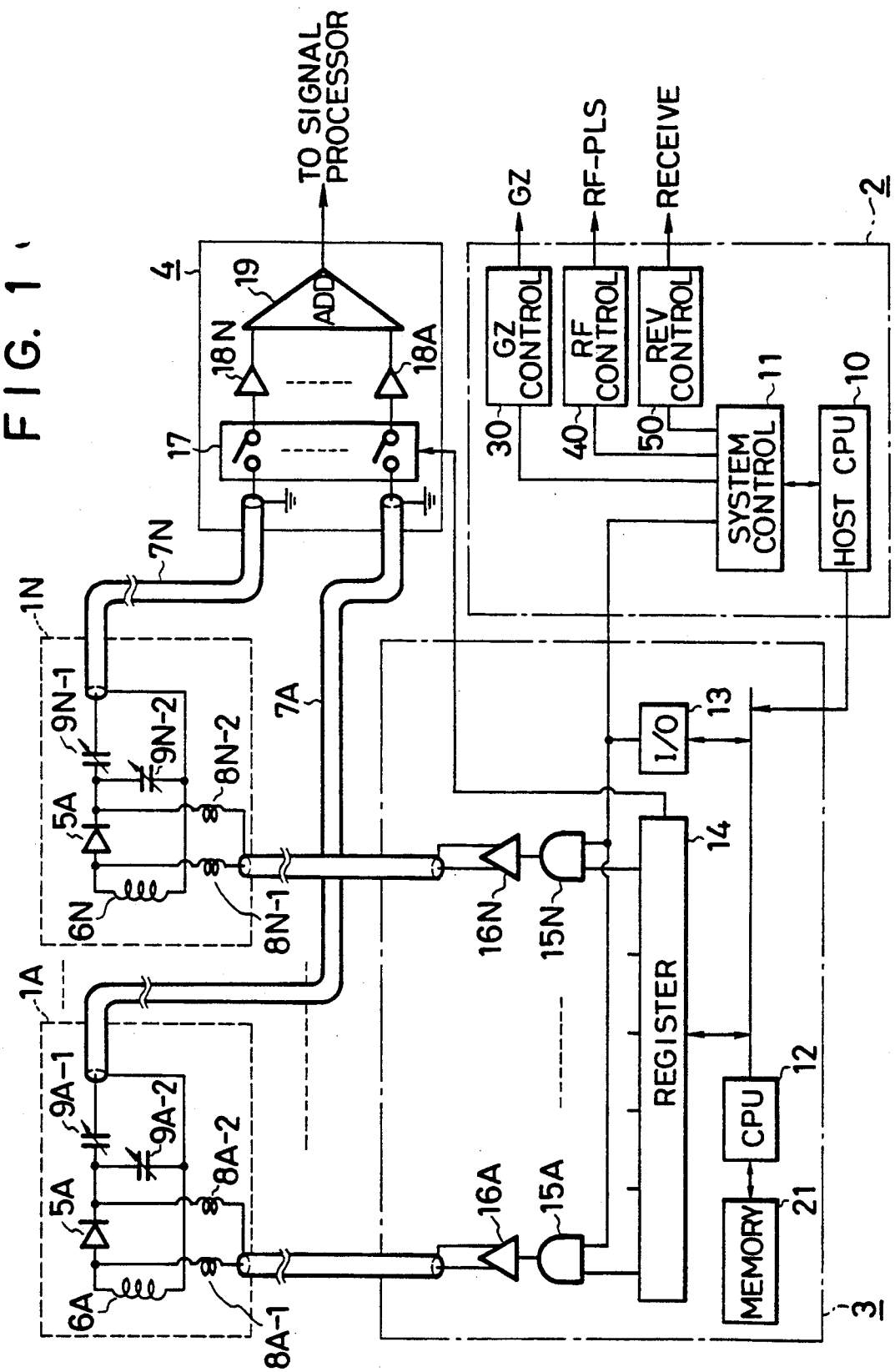
FIG. 1 is a schematic block diagram of an MR imaging apparatus according to a first preferred embodiment of the present invention.

Referring now to FIG. 1, a circuit arrangement of an MR (magnetic resonance) imaging apparatus according to a first preferred embodiment of the present invention will now be described.

In FIG. 1, an NMR signal receiving system of the first MR imaging apparatus comprises: N pieces ("N" being a predetermined integer) of surface coil assemblies 1A to 1N for receiving the NMR signals (FID signals, spin echo signals and the like) produced from an imaged portion of a biological body under medical examination (not shown in detail); an MRI system controller 2 for controlling gradient fields, RF pulse generations, and signal receptions, and furthermore for controlling reading data on an energizing sequence of the surface coil assemblies 1A to 1N; a surface coil selecting unit 3 for selectively energizing these surface coil assemblies in accordance with the preset energizing sequence preset in the MRI system controller 2; and a signal selecting unit 4 for fetching the NMR signals received from the selectively energized surface coil assemblies 1A to 1N.

Since these surface coil assemblies 1A to 1N include the same circuit arrangements, an arrangement of only one coil assembly, e.g., 1A will now be described. The first surface coil assembly 1A includes a PIN diode 5A which will become conductive upon receipt of the coil energizing instruction signal supplied from the coil selecting unit 3; a surface coil 6A capable of receiving the NMR signal derived from the biological body when this PIN diode 5A is conducted; two sets of choke coils 8A-1 and 8A-2 connected to the anode and cathode of the PIN diode 5A; and also two sets of variable capacitors 9A-1 and 9A-2 coupled to the surface coil 6A for a tuning purpose. The NMR signal is received by the surface coil 6A in conjunction with the tuning capacitors 9A-1 and 9A-2 when the PIN diode 5A is brought into the conducting state in response to the coil energizing instruction signal supplied from the coil selecting unit 3, and thereafter supplied via a coaxial cable 7A to a signal selecting unit 4.

The MRI system controller 2 includes a host CPU 10 functioning as a control center for the entire MR imaging apparatus; a gradient field controller 30; an RF (radio-frequency) pulse controller 40; a receiver controller 50; and also a system controller 11 for producing a reception timing signal which is predetermined so as to be in synchronism with the NMR signals.

On the other hand, the surface coil selecting unit 3 includes: a memory 21 in which program data of the coil energizing sequence for these surface coil assemblies 1A to 1N is stored; a local CPU 12 for reading out the energizing sequence program data from the memory 21 so as to deliver the program data to various circuit portions upon receipt of the reception timing signal supplied from the system controller 11; and a register 14 for outputting the coil energizing instruction signal to the selected surface coil assemblies 1A to 1N based on the energizing sequence program data. The surface coil selecting unit 3 further includes AND gates 15A to 15N for AND-gating this coil energizing instruction signal with the reception timing signal outputted from the system controller 11; and drivers 16A to 16 N for applying bias voltages to the PIN diodes 5A to 5N employed in the respective surface coil assemblies 1A to 1N in response to the AND gate signals outputted from the AND gates 15A to 15N.

The signal selecting unit 4 includes an analog switch 17 for fetching the NMR signals derived from only the energized surface coil assemblies 1A to 1N in response to a control signal from the register 14; preamplifiers 18A to 18N for amplifying the corresponding NMR signals which have passed through the analog switch 17; and an adder amplifier 19 for adding the NMR signals amplified by the preamplifiers 18A to 18N, and for outputting the added NMR signals to a signal processor (not shown in detail) employed in the first MR imaging apparatus.

OPERATION OF FIRST MR IMAGING APPARATUS

Figure 2:
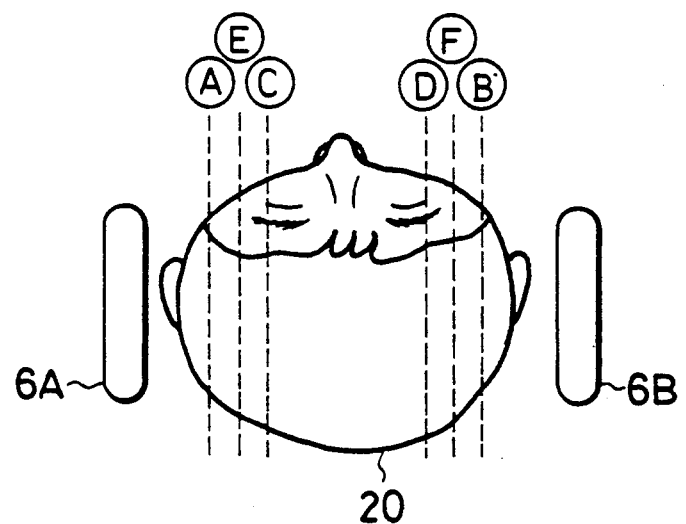
FIG. 2 schematically illustrates two sets of surface coil arrangements for explaining the MR imaging operation by the MR imaging apparatus shown in FIG. 1.

Operations of the first MR imaging apparatus shown in FIG. 1 will now be described with reference to a timing chart represented in FIG. 3 under such a condition that two sets of surface coil assemblies 1A and 1B are employed and two NMR signal reception (surface) coils 6A and 6B are positioned opposite to each other with respect to a head portion 20 of a biological body (see FIG. 2). Also, NMR slice images of the head portion 20 are acquired in a preselected sequence from "A" to "F" in this order, as represented by dot lines of FIG. 2.

Figure 3:
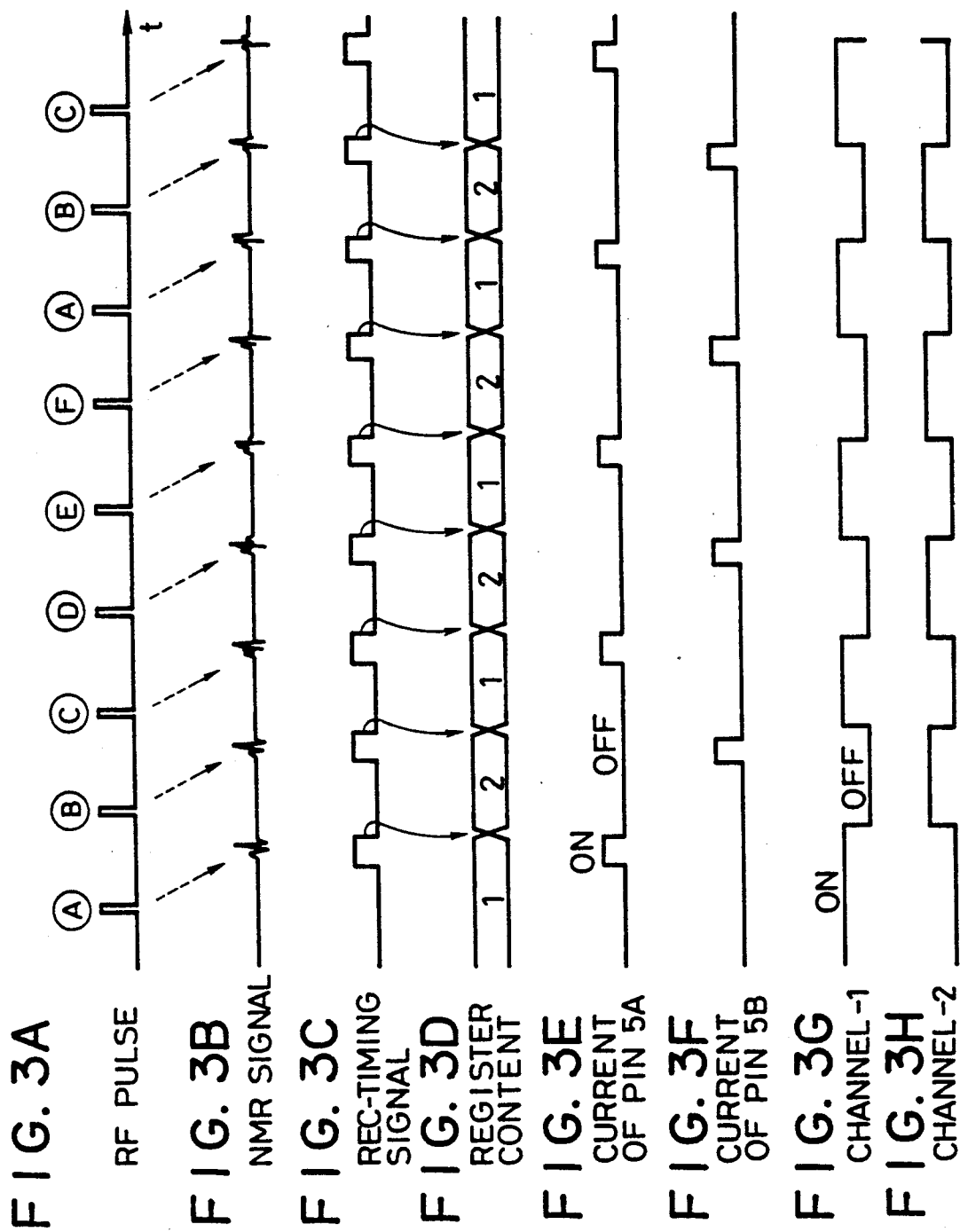
FIG. 3A-3H is a timing chart for explaining the surface coil selections effected in the MR imaging apparatus shown in FIG. 1.

In FIG. 3, when the RF pulses (see FIG. 3A) are supplied to the head portion 20 of the biological body, and then the NMR signals are generated with slight delays after the applications of the respective RF pulses (see FIG. 3B).

It should be noted that coil energizing sequence program data has been previously stored in the memory 21 employed in the coil selecting unit 3 shown in FIG. 1, by which both the first and second surface coils 6A and 6B are alternately energized by the coil selecting unit 3. Accordingly, it is so designed that the outputs from the register 14 shown in FIG. 1 are alternately switched and supplied to the first surface coil 6A side and also second surface coil 6B side respectively every time the reception timing signal (see FIG. 3C) has reached thereto, as represented in FIG. 3D.

Under such circumstances, when the first reception timing signal is supplied from the system controller 11, the AND gate signal is outputted from the first AND gate 15A related to the first surface coil 6A and thus the bias voltage is produced from the relevant driver 6A. As a result, since this bias voltage is applied via two sets of choke coils 8A-1 and 8A-2 between the anode and cathode of the first PIN diode 5A employed in the first surface coil assembly 1A, this PIN diode 5A becomes conductive (see FIG. 3E).

Accordingly, the NMR signal may be received only by the first surface coil 6A and then is furnished via the first coaxial cable 7A to the analog switch 17 of the signal selecting unit 4. At this time, as the analog switch 17 enables a first channel coupled to the first surface coil 6A to be turned ON (see FIG. 3G) in response to the control signal derived from the register 14, the NMR signal received by this first surface coil 6A passes through the analog switch 17 and is amplified by the first preamplifier 18A, and thereafter is supplied to the adder amplifier 19.

Subsequently, upon receipt of a second timing signal derived from the system controller 11, the output from the register 14 is switched to be supplied not to the first surface coil 6A side, but into the second surface coil 6B side, so that an AND gate signal is produced from the second AND gate 15B related to the second surface coil 6B shown in FIG. 2.

As a result, since the second surface coil 6B employed in the second surface coil assembly 1B is made active (see FIG. 3F), the NMR signal received by this second surface coil 6B is supplied to the signal selecting unit 4. Then, since a second channel is brought into the conducting state so as to conduct this NMR signal through the analog switch 17 (see FIG. 3H), the NMR signal is amplified in the relevant preamplifier 18 (not shown in detail), and subsequently, the amplified NMR signal is further supplied to the adder amplifier 19, whereby the resultant NMR signal is similarly supplied to the signal processor.

Subsequently, every time the reception timing signals are supplied to the register 14, the first and second coil assemblies 1A and 1B are alternately and automatically energized so that the NMR signals from the head portion 20 of the biological body are alternately acquired by the first and second surface coils 6A and 6B positioned opposite to each other with respect to this head portion 20 based upon a predetermined coil energizing sequence from "A" to "F".

As previously stated, in case the slice images of the head portion 20 of the biological body under medical examination are alternately acquired at both sides of the head portion 20, the multi surface coil type MR imaging method may be realized by alternately, automatically energizing the first and second surface coils 6A and 6B in accordance with the above-described coil energizing sequence.

That is, in accordance with the first preferred embodiment, a plurality of surface coils 6A to 6N are positioned closely-spaced to each other, and a limited number of surface coils required for the NMR signal acquisition are energized in accordance with a predetermined sequence, so that the desirable NMR signals are obtained from a predetermined portion of the object.

Accordingly, a large number of slice images may be acquired within a short time under the higher S/N ratio in accordance with the multi surface coil type MR imaging method, because only the surface coils, e.g., 6A and 6B, relevant to the NMR signal acquisition are energized and other surface coils are not brought into the active states, to which the noises produced from the biological body may be induced.

ARRANGEMENT OF SECOND MR IMAGING APPARATUS

Figure 4:
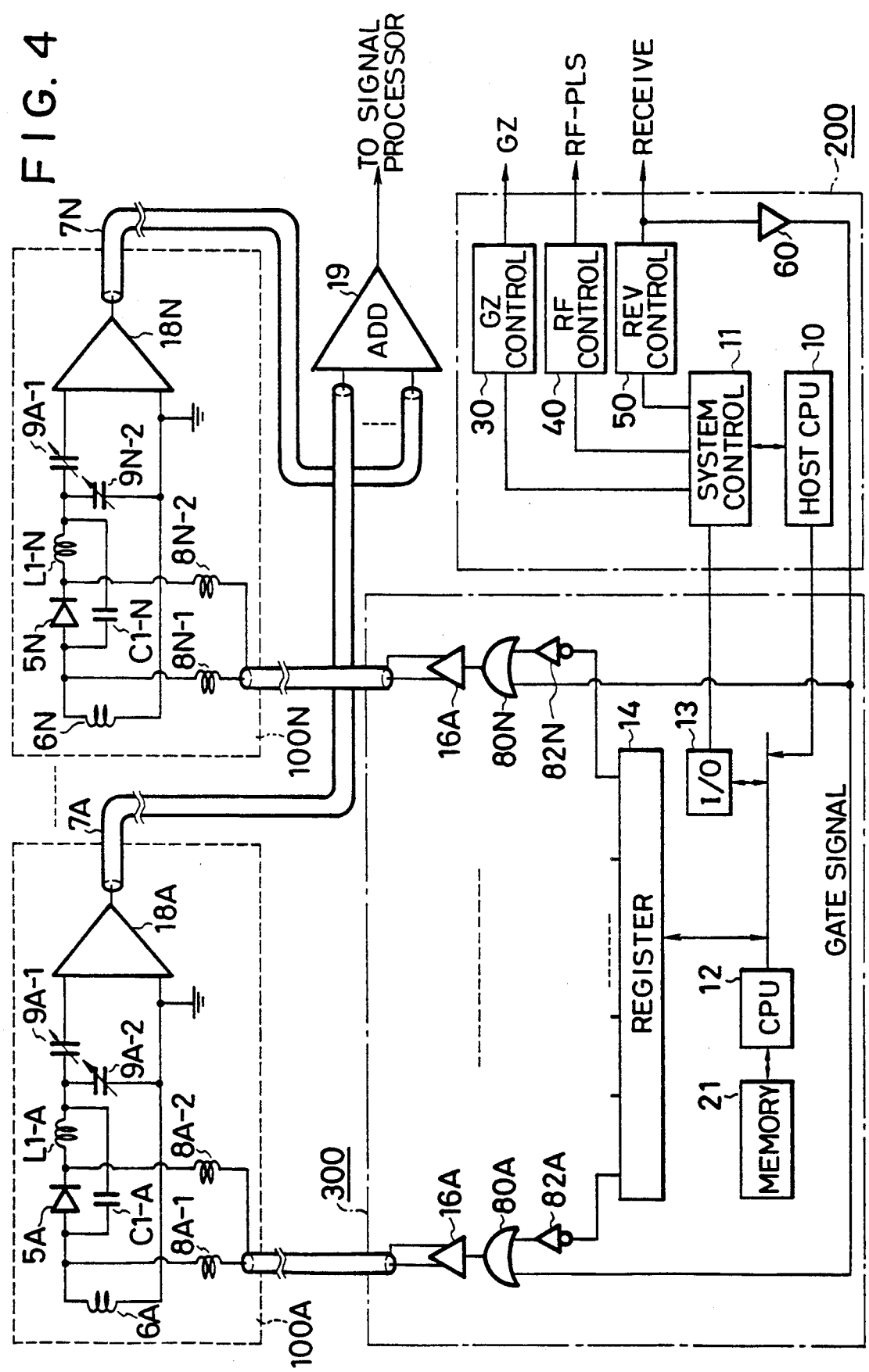
FIG. 4 is a schematic block diagram of an MR imaging apparatus according to a second preferred embodiment of the present invention; and, FIG. 5A-5F is a timing chart for explaining the surface coil selections performed in the MR imaging apparatus shown in FIG. 4.

Referring now to FIG. 4 and 5, another MR imaging apparatus according to a second preferred embodiment of the present invention will be described. It should be noted that the same reference numerals shown in FIG. 1 will be employed for denoting those of circuit elements represented in FIGS. 4 and 5. Also, two sets of surface coils 100A and 100B (not shown in detail) are arranged on both sides of the head portion 20 instead of the surface coils 6A and 6B as represented in FIG. 2. Therefore, only featured circuit arrangements of the second MR imaging apparatus will now be explained.

In an MRI system controller 200, a buffer amplifier 60 is newly employed so as to receive a gate signal from the system controller 11 via the receiver controller 50. The gate signal is produced from the system controller 11 when the RF pulse is transmitted to the biological body. Furthermore, this gate signal is supplied to one input terminal of an OR gate 80A newly employed in the surface coil selecting unit 300. To the other input terminal of this OR gate circuit 80A, the output signal derived from the register 14 is furnished via an inverter 82A. Then, an OR-gated output of this OR gate 80A is supplied to the driver 16A. Similarly, this gate signal is further supplied from the buffer amplifier 60 to other OR gates 80B to 80N.

In each of surface coil assemblies 100A to 100N, a parallel resonance circuit consisting of a capacitor C1-A and an inductor L1-A is newly employed. Since an impedance of this parallel resonance circuit is selected to be a high value, the analog switch 17 shown in FIG. 1 is omitted in the second preferred embodiment. Accordingly, the NMR signals received by the respective surface coils 6A to 6N are directly supplied to the relevant preamplifiers 18A to 18N newly employed in the corresponding surface coil assemblies 100A to 100N. The amplified NMR signals derived from the preamplifier 18A to 18N are supplied via the coaxial cables 7A to 7N to the adder amplifier 19. Since the preamplifiers 18A to 18N are employed at the input sides of the respective coaxial cables 7A to 7N, an S/N ratio of the second MR imaging apparatus is further improved, as compared with that of the first MR imaging apparatus.

A featured operation of the second MR imaging apparatus shown in FIG. 4 is as follows. As apparent from a timing chart shown in FIG. 5, while the RF pulse is being applied to the head portion of the biological body, the PIN diode 5A or 5B relevant to the active surface coils 6A or 6B is being turned ON (conductive), since when the biasing voltage is applied thereto, both the coil L1 and capacitor C1 are brought into a parallel resonance condition. As a consequence, the NMR signal receiving circuit 100A or 100B may be prevented from being broken down caused by receiving high power of RF pulses.

It should be noted that the first and second surface coil assemblies 100A and 100B are alternately energized so as to be able to receive the NMR signals from the head portion 20 of the biological body in a predetermined energizing sequence "A" to "F", which is similar to the signal acquisition by the first MR imaging apparatus.

MODIFICATIONS

The present invention is not limited to the above-described preferred embodiments, but may be readily modified without departing from the technical spirit and scope of the present invention.

Although only two sets of surface coils were positioned on both sides of the head portion of the biological body, more than two surface coils may be positioned under a spine, closely-spaced with each other.

Since the NMR signal receiving coils, i.e., surface coils may produce signals having considerably high levels during the RF pulse transmission, the signals may be utilized so as to produce the above-described gate signals.

What is claimed is:

1. A magnetic resonance imaging apparatus comprising:

a plurality of coil means having signal sensitive regions with respect to different portions of a biological body to be imaged for performing at least reception of NMR (nuclear magnetic resonance) signals induced from the different portions of the biological body;

memory means for previously storing sequence data for energizing said plurality of coil means; and control means for reading out the stored sequence data so as to energize only a selected number of said plurality of coil means, said control means including a first controller for producing a reception timing signal preset to be synchronized with generation of the NMR signals, a second controller for reading the coil energizing sequence data from the memory means in response to the reception timing signal derived from the first controller and, energizing voltage producing means for producing an energizing voltage to be supplied to said selected number of said plurality of coil means in accordance with both said reception timing signal and said coil energizing sequence data.

2. A magnetic resonance imaging apparatus as claimed in claim 1, wherein said plurality of coil means are constructed of a first coil assembly and a second coil assembly positioned opposite to said first coil assembly with respect to the portions of the biological body.

3. A magnetic resonance imaging apparatus as claimed in claim 1, wherein said plurality of coil means are positioned adjacent one another along one plane of the biological body.

4. A magnetic resonance imaging apparatus as claimed in claim 1, wherein said biasing voltage producing means includes a register and a plurality of AND gates coupled between said memory means and said PIN diodes.

5. A magnetic resonance imaging apparatus as claimed in claim 1, wherein said coil means includes means for transmitting RF (radio frequency) pulses to the portions of the biological body and also for receiving the NMR signals induced therefrom.

6. A magnetic resonance imaging apparatus comprising:
a plurality of coil means having signal sensitive regions with respect to different portions of a biological body to be imaged for performing at least reception of NMR (nuclear magnetic resonance) signals induced from the different portions of the biological body, wherein each one of said plurality of coil means includes a coil member capable of receiving the NMR signals induced from the portions of the biological body in conjunction with a tuning capacitor, and a PIN diode interposed between the coil member and tuning capacitor and becoming conductive when a biasing voltage is applied thereto, whereby the NMR signals are received by the coil member in conjunction with the tuning capacitor;
memory means for previously storing sequence data for energizing said plurality of coil means; and
control means for reading out the stored sequence data so as to energize only a selected number of said plurality of coil means, said control means including a first controller for producing a reception timing signal preset to be synchronized with generation of the NMR signals, a second controller for reading the coil energizing sequence data from the memory means in response to the reception timing signal derived from the first controller and, biasing voltage producing means for producing a biasing voltage to be supplied to said PIN diode employed in each of said plurality of coil means in accordance with both said reception timing signal and said coil energizing sequence data.

7. A magnetic resonance imaging apparatus as claimed in 8, wherein said biasing voltage producing means includes a register and a plurality of OR gates coupled between said memory means and said PIN diodes.

8. A magnetic resonance imaging apparatus comprising:
a plurality of coil means having signal sensitive regions with respect to different portions of a biological body to be imaged for performing at least reception of NMR (nuclear magnetic resonance) signals induced from the different portions of the biological body;
memory means for previously storing sequence data for energizing said plurality of coil means; and
control means for reading out the stored sequence data so as to energize only a selected number of said plurality of coil means, said control means including a first controller for producing a gate signal in response to generation of a RF (radio frequency) pulse to the biological body, and also a reception timing signal preset to be synchronized with generation of the NMR signals, a second controller for reading the coil energizing sequence data from the memory means in response to the reception timing signal derived from the first controller; and energizing voltage producing means for producing an energizing voltage to be supplied to said selected number of said plurality of said coil means based upon both said gate signal and said coil energizing sequence data.

9. A magnetic resonance imaging apparatus comprising:
a plurality of coil means having signal sensitive regions with respect to different portions of a biological body to be imaged for performing at least reception of NMR (nuclear magnetic resonance) signals induced from the different portions of the biological body, wherein each one of said plurality of coil means includes a coil member capable of receiving the NMR signals induced from the portion of the biological body in conjunction with a tuning capacitor, a PIN diode interposed between the coil member and tuning capacitor; and a parallel resonance circuit connected parallel to the PIN diode and becoming non-conductive when a biasing voltage is applied thereto, whereby the reception of the NMR signals by the coil member is interrupted;
memory means for previously storing sequence data for energizing said plurality of coil means; and
control means for reading out the stored sequence data so as to energize only a selected number of said plurality of coil means, said control means including a first controller for producing a gate signal in response to generation of an RF (radio frequency) pulse to the biological body, and also a reception timing signal preset to be synchronized with generation of the NMR signals, a second controller for reading the coil energizing sequence data from the memory means in response to the reception timing signal derived from the first controller; and biasing voltage producing means for producing a biasing voltage to be supplied to said PIN diode employed in each of the coil assemblies based upon both said gate signal and said coil energizing sequence data.

* * * * *